(12) United States Patent
Guo

(10) Patent No.: US 11,864,371 B2
(45) Date of Patent: Jan. 2, 2024

(54) METHOD FOR MANUFACTURING SEMICONDUCTOR STRUCTURE AND SEMICONDUCTOR STRUCTURE

(71) Applicant: CHANGXIN MEMORY TECHNOLOGIES, INC., Hefei (CN)

(72) Inventor: Shuai Guo, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 189 days.

(21) Appl. No.: 17/603,949

(22) PCT Filed: Jul. 28, 2021

(86) PCT No.: PCT/CN2021/108950
§ 371 (c)(1),
(2) Date: Oct. 15, 2021

(87) PCT Pub. No.: WO2023/000360
PCT Pub. Date: Jan. 26, 2023

(65) Prior Publication Data
US 2023/0121343 A1    Apr. 20, 2023

(30) Foreign Application Priority Data

Jul. 19, 2021 (CN) .......................... 202110812549.0

(51) Int. Cl.
*H10B 12/00* (2023.01)
(52) U.S. Cl.
CPC ............. *H10B 12/05* (2023.02); *H10B 12/33* (2023.02)

(58) Field of Classification Search
CPC ........ H10B 12/00; H10B 12/05; H10B 12/33; H01L 24/80–89
See application file for complete search history.

(56) References Cited

U.S. PATENT DOCUMENTS

| 7,498,622 B1 | 3/2009 | Chapman et al. |
| 9,000,409 B2 | 4/2015 | Huo et al. |
| 2002/0020862 A1 | 2/2002 | Livengood et al. |
| 2005/0274604 A1* | 12/2005 | Saito ...................... C25D 17/06 204/198 |
| 2015/0076625 A1 | 3/2015 | Noguchi et al. |
| 2019/0198663 A1* | 6/2019 | Sakai .................. H01L 29/0865 |

OTHER PUBLICATIONS

Written Opinion of the International Searching Authority (WO/ISA) in Application No. PCT/CN2021/108950, dated Apr. 20, 2022.
International Search Report in Application No. PCT/CN2021/108950, dated Apr. 20, 2022.

* cited by examiner

*Primary Examiner* — Mohammad M Hoque
*Assistant Examiner* — Kevin Quinto
(74) *Attorney, Agent, or Firm* — Syncoda LLC; Feng Ma

(57) ABSTRACT

A method for manufacturing a semiconductor structure includes: providing a substrate, the substrate having a first surface and a second surface opposite to each other, and a transistor being arranged on the second surface; forming release holes in the substrate, the release holes extending into the transistors, bottoms of the release holes being located in channel regions of the transistors, and top surfaces of the release holes being flush with the first surface; and forming a conductive structure in the release holes.

12 Claims, 7 Drawing Sheets

```
┌─────────────────────────────────────────────────────────────┐
│ Provide a substrate, the substrate having a first surface   │
│ and a second surface opposite to each other, and            │─── S100
│ transistors being arranged on the second surface            │
└─────────────────────────────────────────────────────────────┘
                              │
┌─────────────────────────────────────────────────────────────┐
│ Form release holes in the substrate, the release holes      │
│ extending into the transistors, bottoms of the release      │
│ holes being located in channel regions of the transistors,  │─── S200
│ and top surfaces of the release holes being flush with      │
│ the first surface                                           │
└─────────────────────────────────────────────────────────────┘
                              │
┌─────────────────────────────────────────────────────────────┐
│ Form a conductive structure in the release holes, the       │
│ conductive structure extending to the outside of the        │─── S300
│ release holes and covering the first surface above the      │
│ substrate                                                   │
└─────────────────────────────────────────────────────────────┘
```

FIG. 1

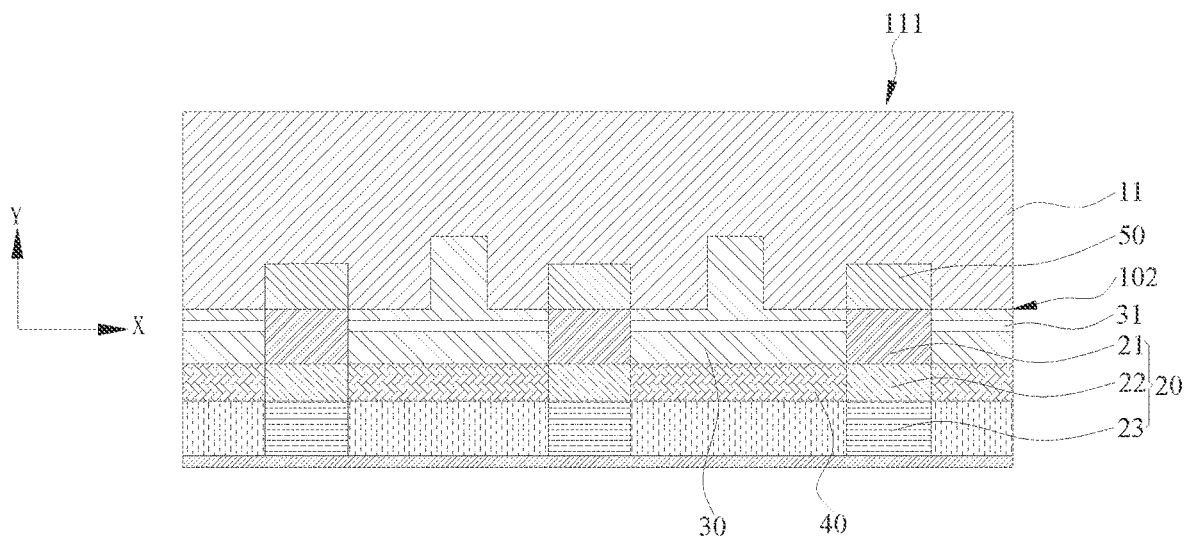

FIG. 2

METHOD FOR MANUFACTURING SEMICONDUCTOR STRUCTURE AND SEMICONDUCTOR STRUCTURE

CROSS-REFERENCE TO RELATED APPLICATIONS

This application is a national stage of International Application No. PCT/CN2021/108950 filed on Jul. 28, 2021, which claims priority to Chinese Patent Application No. 202110812549.0, filed on Jul. 19, 2021. The disclosures of these applications are hereby which is incorporated herein by reference in their entirety.

TECHNICAL FIELD

The present disclosure relates to, but is not limited to, a method for manufacturing a semiconductor structure and a semiconductor structure.

BACKGROUND

Dynamic Random Access Memories (DRAMs) have the advantages of small size, high integration and low power consumption, and are faster than all Read Only Memories (ROMs). With the increase in integration, the feature size of a capacitor and the area of an electrode plate continue to decrease, so dielectric materials that are thinner or/and have higher dielectric constants have to be used to increase the capacitance density. With the development of the semiconductor industry, the critical dimensions of devices such as DRAMs continue to decrease.

However, as the critical dimensions of the devices continue to decrease, a floating gate effect will occur between a transistor and a substrate. This is because, when the transistor is in an off state, some charges in the capacitor structure move into the transistor through a capacitor contact structure and a capacitor pad, as a result, holes in the transistor are increased to increase the voltage in the transistor, a voltage difference is produced between the transistor and the substrate, and then the floating gate effect is produced, which will affect the performance of the semiconductor structure.

SUMMARY

The subject matter is described in detail herein below, which is not intended to limit the scope of protection of claims.

The present disclosure provides a method for manufacturing a semiconductor structure and a semiconductor structure.

The first aspect of the present disclosure provides a method for manufacturing a semiconductor structure, including:

providing a substrate, the substrate having a first surface and a second surface opposite to each other, and transistors being arranged on the second surface;

forming release holes in the substrate, the release holes extending into the transistors, bottoms of the release holes being located in channel regions of the transistors, and top surfaces of the release holes being flush with the first surface; and forming a conductive structure in the release holes, the conductive structure extending to the outside of the release holes and covering the first surface above the substrate.

The second aspect of the embodiments of the present disclosure provides a semiconductor structure, comprising:

a substrate, the substrate having a first surface and a second surface opposite to each other, a plurality of transistors being arranged on the second surface, and the transistors being arranged in an array; and a conductive structure, the conductive structure comprising a conductive body and a plurality of conductive bumps arranged on the conductive body, the conductive body being arranged on the first surface, the conductive bumps and the transistors being arranged in one-to-one correspondence, and ends of the conductive bumps away from the conductive body passing through the substrate and sources of the transistors and then being communicated with channel regions of the transistors.

In the method for manufacturing a semiconductor structure and the semiconductor structure provided by the embodiments of the present disclosure, a conductive structure is formed in the substrate, one end of the conductive structure is connected to the transistor, and when there are excess holes in the transistor, the holes can be transferred to the outside of the substrate by the conductive structure, thereby avoiding the floating gate effect between the substrate and the transistors and improving the performance of the semiconductor structure.

After the drawings and detailed description are read and understood, other aspects may be understood.

BRIEF DESCRIPTION OF THE DRAWINGS

The drawings, which are incorporated in and constitute a part of the specification, illustrate embodiments of the present disclosure and together with the description serve to explain the principles of the embodiments of the present disclosure. In these drawings, similar reference numerals are configured to represent similar elements. The drawings in the following description are only some rather than all of the embodiments of the present disclosure. Those skilled in the art would be able to derive other drawings from these drawings without any creative efforts.

FIG. 1 is a flowchart of a method for manufacturing a semiconductor structure according to an exemplary embodiment.

FIG. 2 is a schematic diagram of forming a substrate and a transistor in the method for manufacturing a semiconductor structure according to an exemplary embodiment.

Figure 3:
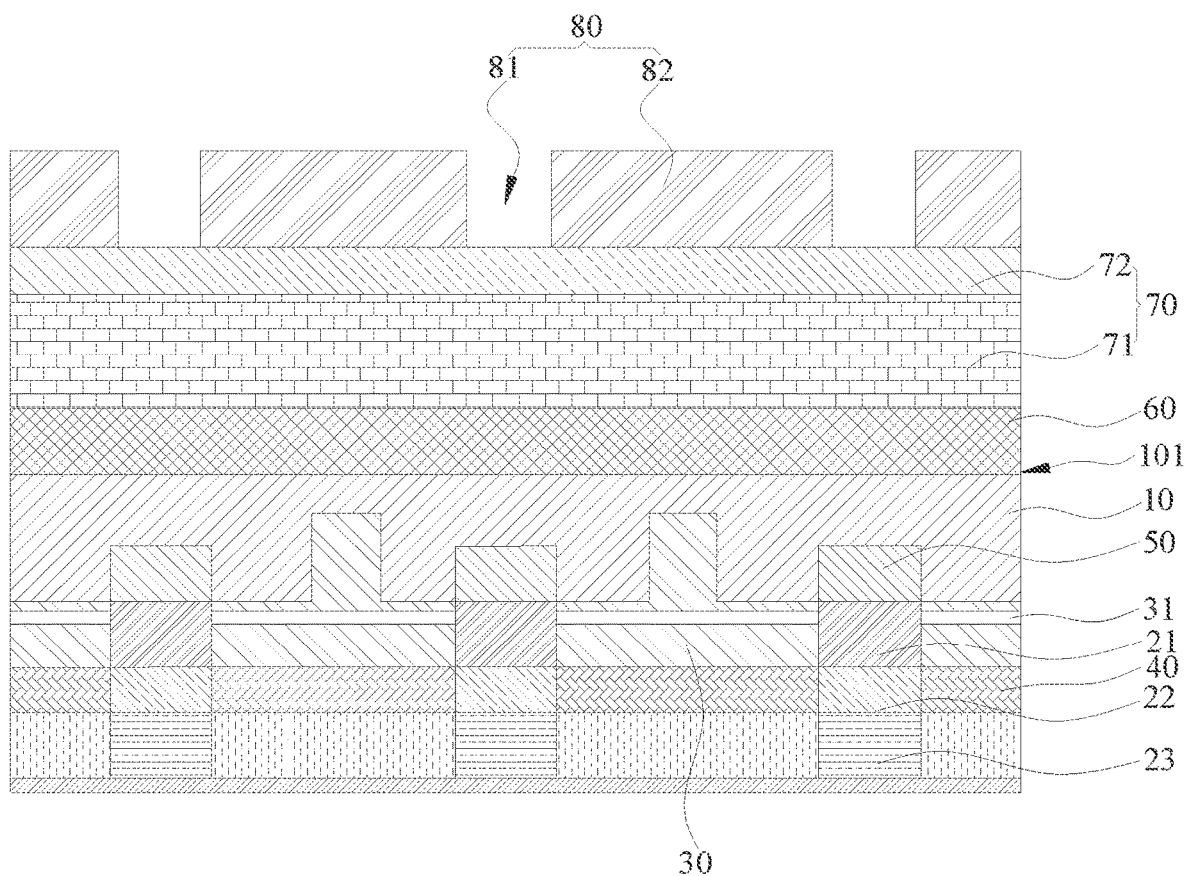
FIG. 3 is a schematic diagram of forming a first opening in the method for manufacturing a semiconductor structure according to an exemplary embodiment.

Reference numerals:

| | |
|---|---|
| 10 - substrate; | 11 - initial substrate; |
| 20 - transistor; | 21 - source; |
| 22 - channel region; | 23 - drain; |
| 30 - isolation structure; | 31 - air gap layer; |
| 40 - word line; | 50 - bit line structure; |
| 60 - first dielectric layer; | 70 - mask layer; |
| 71 - first mask layer; | 72 - second mask layer; |
| 80 - photoresist layer; | 81 - first opening; |
| 82 - bump; | 83 - second opening; |
| 90 - release hole; | 100 - oxide layer; |
| 110 - initial oxide layer; | 130 - second dielectric layer; |
| 131 - second initial dielectric layer; | 140 - intermediate hole; |
| 150 - conductive structure; | 151 - conductive body; |
| 152 - conductive bump; | 160 - capacitor contact structure; |
| 161 - first contact structure; | 162 - second contact structure; |
| 1611 - first segment; | 1612 - second segment; |
| 1621 - third segment; | 1622 - fourth segment; |
| 170 - capacitor structure; | 171 - upper electrode; |
| 172 - dielectric layer; | 173 - lower electrode; |
| 180 - capacitor pad. | |

DETAILED DESCRIPTION

In order to make the objectives, technical solutions and advantages of the embodiments of the present disclosure clearer, the following clearly and completely describes the technical solutions in the embodiments of the present disclosure with reference to the accompanying drawings in the embodiments of the present disclosure. Apparently, the described embodiments are only part of the embodiments of the present disclosure, not all of them. All other embodiments obtained by those skilled in the art based on the embodiments of the present disclosure without any creative efforts shall fall within the protection scope of the present disclosure. It should be noted that the embodiments in the present disclosure and the features in the embodiments can be combined with each other on a non-conflict basis.

A floating gate effect may occur between a transistor and a substrate in a semiconductor structure, and the floating gate effect will affect the performance of the semiconductor structure. After search, the inventor found, this is because, when the transistor is in an off state, some charges in the capacitor structure move into the transistor through a capacitor contact structure and a capacitor pad, as a result, holes in the transistor are increased to increase the voltage in the transistor, and a voltage difference is produced between the transistor and the substrate to produce the floating gate effect.

In view of the above technical problems, in the method for manufacturing a semiconductor structure and the semiconductor structure provided by the embodiments of the present disclosure, a conductive structure is formed in the substrate, one end of the conductive structure is connected to the transistor, and when there are excess holes in the transistor, the holes can be transferred to the outside of the substrate by the conductive structure, thereby avoiding the floating gate effect between the substrate and the transistor and improving the performance of the semiconductor structure.

An exemplary embodiment of the present disclosure provides a method for manufacturing a semiconductor structure, as shown in FIG. 1. FIG. 1 shows a flowchart of a method for manufacturing a semiconductor structure according to an exemplary embodiment of the present disclosure, and FIGS. 2 to 10 are schematic diagrams of various stages of the method for manufacturing a semiconductor structure. The method for manufacturing a semiconductor structure will be introduced below in conjunction with FIGS. 2 to 10.

This embodiment does not limit the semiconductor structure. The following will introduce the semiconductor structure by taking a Dynamic Random Access Memory (DRAM) as an example, but this embodiment is not limited to this. The semiconductor structure in this embodiment may also be other structure.

As shown in FIG. 1, a method for manufacturing a semiconductor structure provided by an exemplary embodiment of the present disclosure includes the following steps:

Step S100: a substrate is provided, the substrate having a first surface and a second surface opposite to each other, and transistors being arranged on the second surface.

Figure 9:
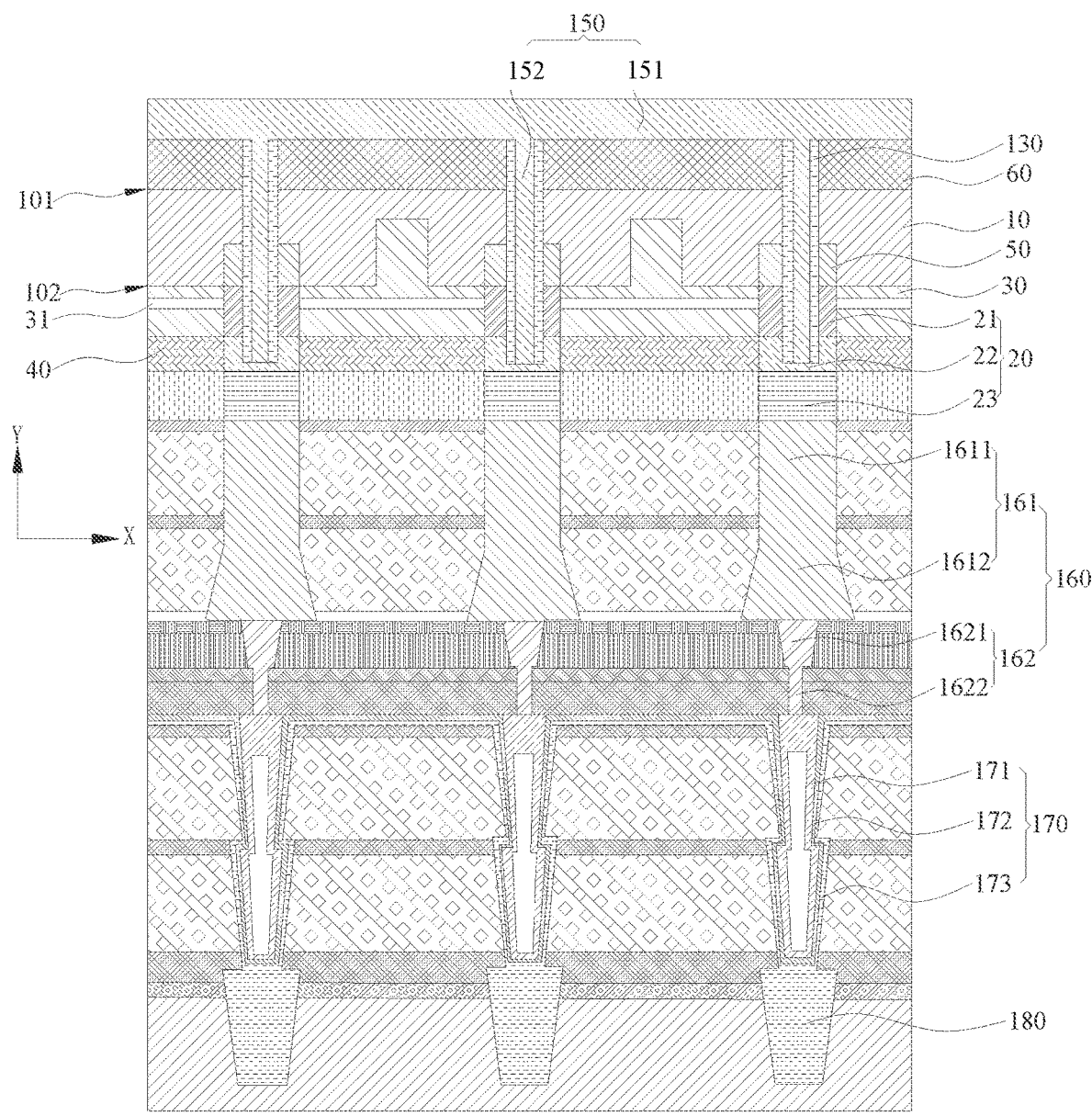
FIG. 9 is a schematic diagram of forming a conductive structure in the method for manufacturing a semiconductor structure and a schematic diagram of a semiconductor structure according to an exemplary embodiment.

Exemplarily, as shown in FIG. 2 and FIG. 9, the substrate 10 is used as a support component of the dynamic random access memory to support other components disposed thereon. The substrate 10 may be made of a semiconductor material, and the semiconductor material may be one or more of silicon, germanium, a silicon-germanium compound and a silicon-carbon compound.

In a direction perpendicular to the substrate 10, that is, the Y direction shown in the figures, the substrate 10 has a first surface 101 and a second surface 102 opposite to each other, wherein the first surface 101 may be understood as a top surface of the substrate 10, and the second surface 102 may be understood as a bottom surface of the substrate 10.

Exemplarily, as shown in FIG. 2, an initial substrate 11 is provided, the initial substrate 11 having a first initial surface 111 and a second surface 102 opposite to each other;

In a vertical direction where the first initial surface 111 points to the second surface 102, part of the thickness of the initial substrate 11 is removed, the surface of the remaining of the initial substrate 11 forms the first surface 101, and the remaining of the initial substrate 11 forms the substrate 10.

That is, the first initial surface 111 may be planarized using a chemical mechanical polishing process, and remove part of the thickness of the initial substrate 11, the remaining of the initial substrate 11 forms the substrate 10, and the planarized first initial surface 111 forms the first surface 101.

In this embodiment, a transistor 20 is further arranged on the second surface 102. For example, an isolation structure 30 may be formed on the second surface through a deposition process, then the isolation structure 30 is patterned to form a plurality of trenches in the isolation structure 30, the trenches are arranged at intervals in a first direction, that is, the X direction shown in FIG. 2, a bit line structure 50 is formed in each trench, and a plurality of active columns arranged in an array are formed on the bit line structures 50.

After the active columns are formed, a word line 40 extending in the first direction is formed on the isolation structure 30, part of the word line 40 wraps a channel region 22 of each active column, and each active column and the word line 40 wrapping the active column constitute a transistor 20.

An air gap layer 31 is further formed in the isolation structure 30.

Step S200, release holes are formed in the substrate, the release holes extending into the transistors, bottoms of the release holes being located in channel regions of the transistors, and top surfaces of the release holes being flush with the first surface.

Illustratively, as shown in FIG. 3, a mask layer 70 is formed on the first surface 101. The mask layer 70 may be formed on the first surface 101 by a deposition process.

It should be noted that, in this embodiment, the mask layer 70 may be a single film layer or a laminated structure. When the mask layer 70 includes a laminated structure, the mask layer may include a first mask layer 71 and a second mask layer 72 laminated, the first mask layer 71 is arranged on a first dielectric layer 60, and the first dielectric layer 60 may include a silicon oxide layer, wherein the material of the first mask layer 71 is different from the material of the second mask layer 72, for example, the material of the first mask layer 71 may include amorphous carbon, and the material of the second mask layer 72 may include silicon oxynitride.

After the mask layer 70 is formed, a photoresist layer 80 may be formed on the mask layer 70 by coating, and then the photoresist layer is patterned by exposure, development, or etching to form a mask pattern in the photoresist layer 80, wherein the mask pattern includes a plurality of first openings 81 and bumps 82 for separating the first openings 81, the number of the first openings 81 corresponds to the number of the transistors 20 one to one, and the projection of the first opening 81 in the transistor 20 is located in a source 21 of the transistor 20.

Figure 5:
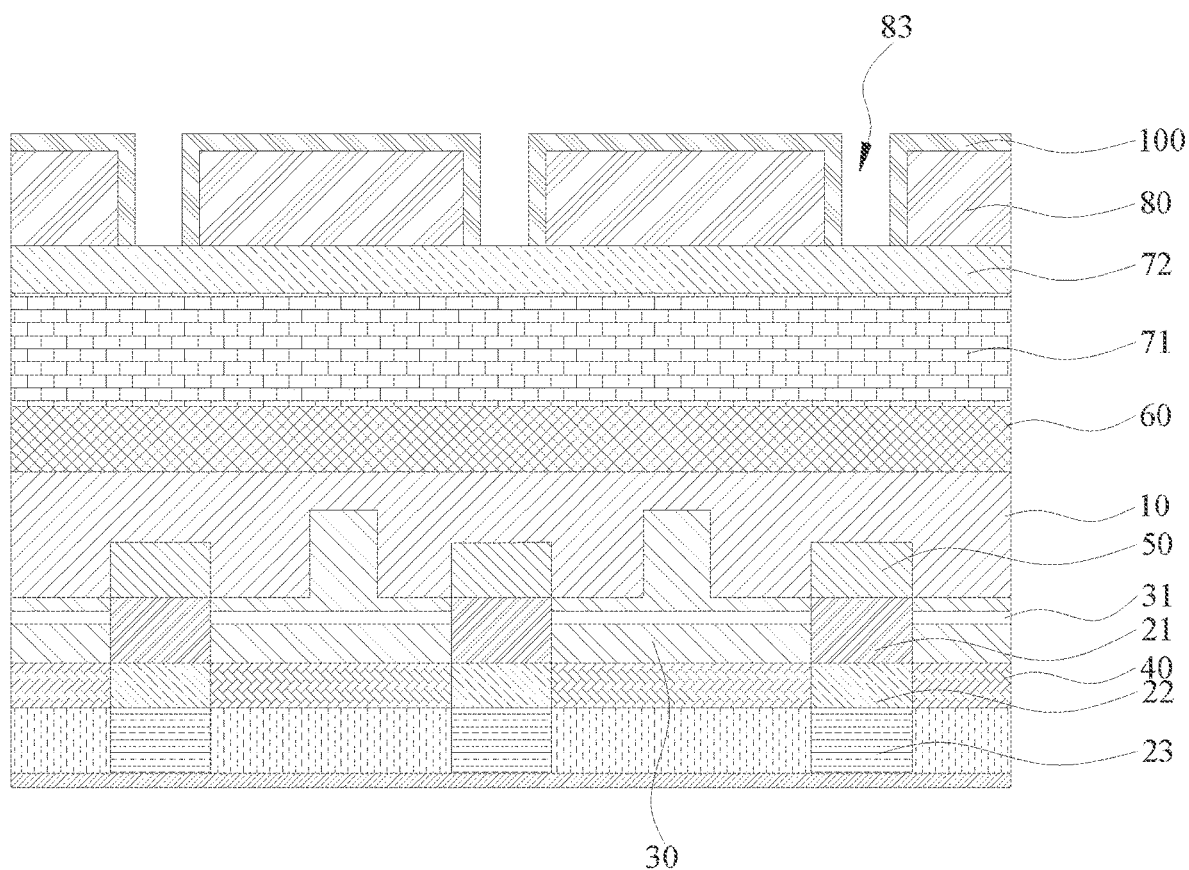
FIG. 5 is a schematic diagram of forming an oxide layer and a second opening in the method for manufacturing a semiconductor structure according to an exemplary embodiment.

As shown in FIG. 5, an oxide layer 100 is formed on side walls of the first openings 81, the oxide layer 100 extends to the outside of the first openings 81 and cover the top surface of the mask layer 70, and the oxide layer 100 located in the first openings 81 encloses second openings 83, wherein the oxide layer 100 may be a silicon oxide layer.

Figure 4:
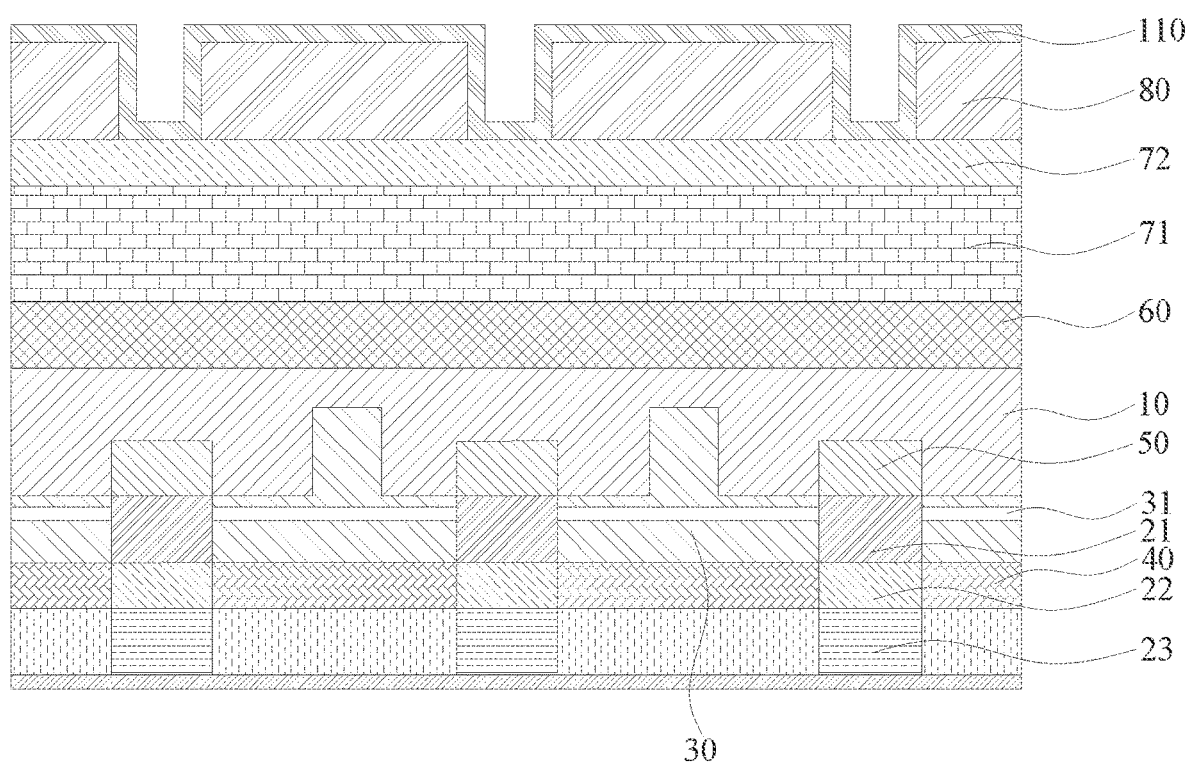
FIG. 4 is a schematic diagram of forming an initial oxide layer in the method for manufacturing a semiconductor structure according to an exemplary embodiment.

For example, as shown in FIG. 4, an initial oxide layer 110 may be formed on the side walls and bottom walls of the first openings 81 by an atomic layer deposition process, and the initial oxide layer 110 extends to the outside of the first openings 81 and covers the top surface of the mask layer 70.

Then, the initial oxide layer 110 located on the bottom walls of the second openings 83 is removed with an etching gas or etching solution, and the remaining of the initial oxide layer 110 forms the oxide layer 100, that is, the formed oxide layer 100 covers the top surfaces and side walls of the bumps 82, wherein the oxide layer 100 located in the first openings 81 encloses the second openings 83.

In this embodiment, the oxide layer 100 is formed to reduce the diameter of the first openings 81, thereby reducing the diameter of the release holes 90, reducing excessive damage to the transistors 20 by the release holes 90, and ensuring the performance of the transistors 20.

Figure 6:
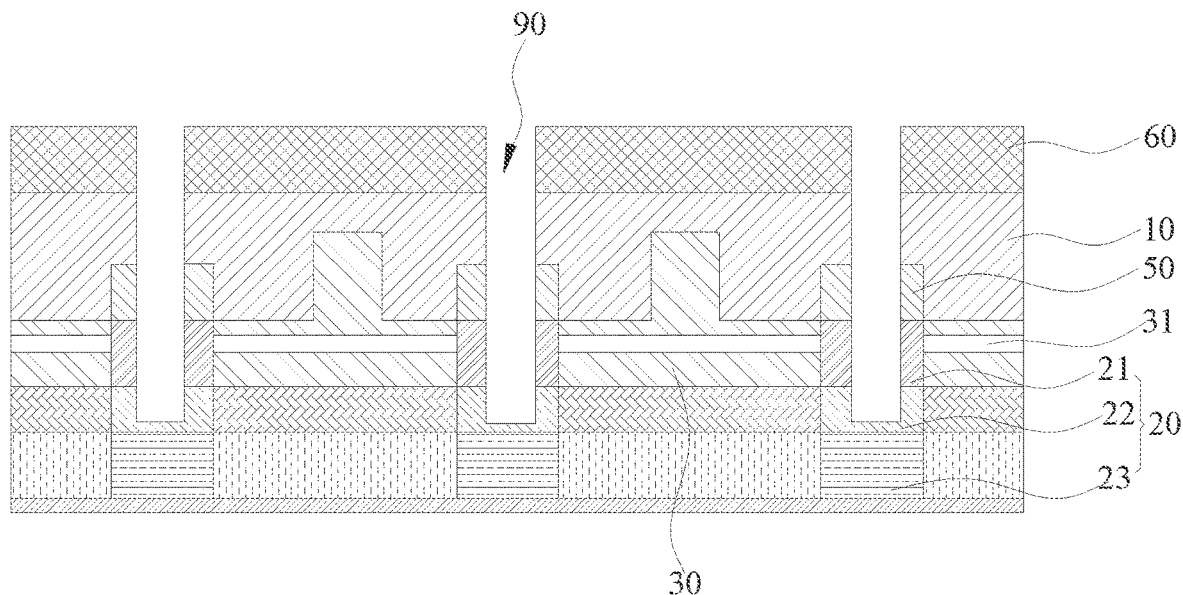
FIG. 6 is a schematic diagram of forming a release hole in the method for manufacturing a semiconductor structure according to an exemplary embodiment.

Finally, the mask layer 70, the substrate 10, the sources 21 of the transistors 20 and part of the channel regions 22 of the transistors 20 that are exposed in the second openings 83 are removed with the etching solution or etching gas, to form the release holes 90, as shown in FIG. 6.

It should be noted that, in this embodiment, a part of the release holes 90 are located in the transistors 20, and the other part are located in the substrate 10. In addition, in some embodiments, after the release holes 90 are formed, the photoresist layer 80, the mask layer 70 and the oxide layer 100 need to be removed by dry or wet etching.

In this embodiment, the mask layer 70 is of a laminated structure. During pattern transfer, the second mask layer 72 may be first etched with the mask pattern formed by the bumps 82 covered with the oxide layer 100 as a mask, and form a patterned second mask layer 72, and then the first mask layer 71, the substrate 10 and the transistors 20 continue to be etched with the patterned second mask layer 72 as a mask, to form the release holes 90.

In this embodiment, multiple times of pattern transfer can ensure the accuracy of the pattern finally transferred to the substrate 10 and the transistors 20, and improve the accuracy of the release hole 90.

In some embodiments, after the providing a substrate 10 and before the forming a mask layer 70 on the first surface 101, the method for manufacturing a semiconductor structure further includes forming a first dielectric layer 60 on the first surface 101, that is, the first dielectric layer 60 is arranged between the first surface 101 and the mask layer 70.

In this embodiment, the first dielectric layer 60 is arranged on the first surface 101 to protect the substrate 10, which can reduce lateral etching of the substrate 10 when the release holes 90 are formed, to improve the performance of the semiconductor structure.

Step S300, a conductive structure is formed in the release holes, the conductive structure extending to the outside of the release holes and covering the first surface above the substrate.

Figure 7:
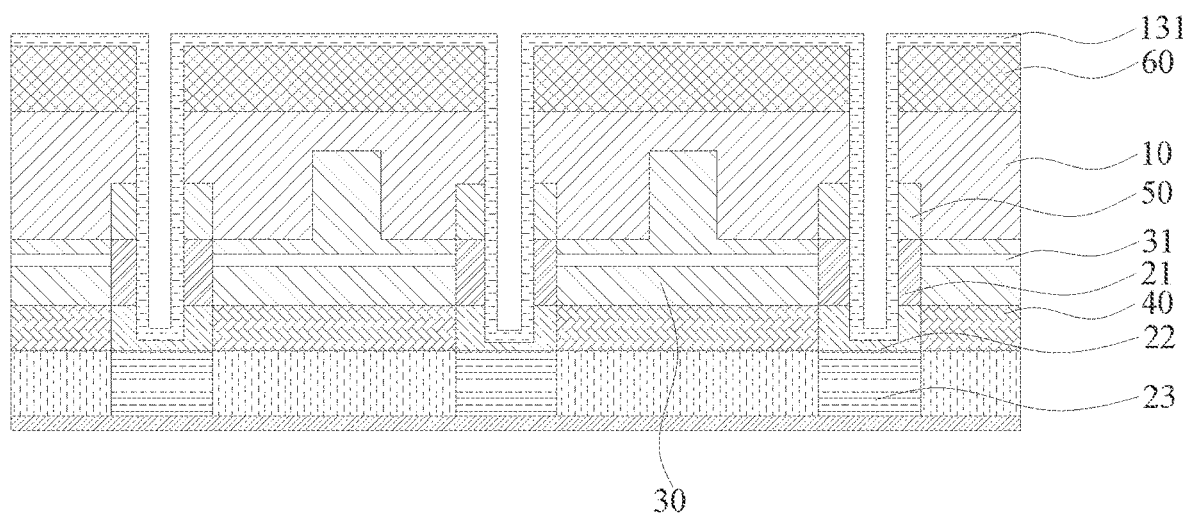
FIG. 7 is a schematic diagram of forming a second initial dielectric layer in the method for manufacturing a semiconductor structure according to an exemplary embodiment.

Exemplarily, as shown in FIG. 7, first, a second initial dielectric layer 131 is formed in the release holes 90 by an atomic layer deposition process, the second initial dielectric layer 131 extending to the outside of the release holes 90 and covering the first dielectric layer 60.

Figure 8:
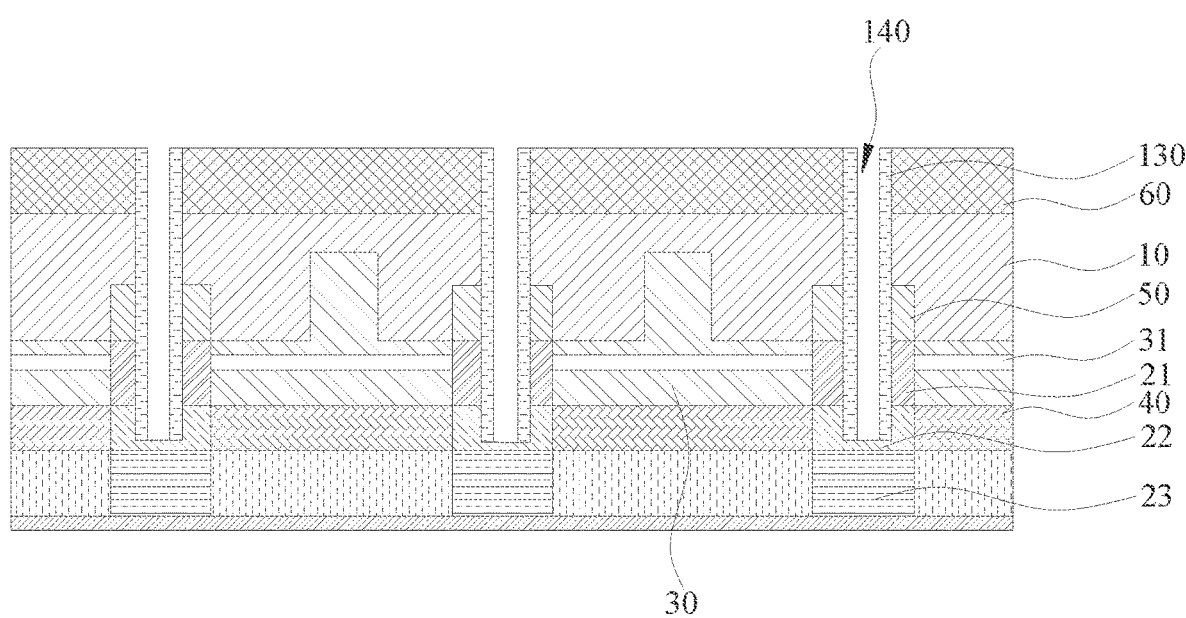
FIG. 8 is a schematic diagram of forming a second dielectric layer and an intermediate hole in the method for manufacturing a semiconductor structure according to an exemplary embodiment.

Then, the second initial dielectric layer 131 on the first dielectric layer 60 and the second initial dielectric layer 131 on the bottom of the release holes 90 are removed with an etching solution or etching gas, the remaining of the second initial dielectric layer 131 forms a second dielectric layer 130, and the second dielectric layer 130 encloses intermediate holes 140 in the release holes 90, as shown in FIG. 8.

As shown in FIG. 9, the conductive structure 150 is formed in the intermediate holes by a deposition process, the conductive structure 150 extending to the outside of the intermediate holes 140 and covering the first dielectric layer 60, wherein the material of the conductive structure 150 may include conductive materials such as copper, aluminum or tungsten.

It should be noted that, in this embodiment, the deposition process may include an atomic layer deposition process, a physical vapor deposition process, or a chemical vapor deposition process.

In the method for manufacturing a semiconductor structure and the semiconductor structure provided by the embodiments of the present disclosure, a conductive structure is formed in the substrate, one end of the conductive structure is connected to the transistors, and when there are excess holes in the transistors, the holes can be transferred to the outside of the substrate by the conductive structure, thereby avoiding the floating gate effect between the substrate and the transistors and improving the performance of the semiconductor structure.

As shown in FIG. 9, an embodiment of the present disclosure further provides a semiconductor structure, including:

a substrate 10, the substrate 10 having a first surface 101 and a second surface 102 opposite to each other, a plurality of transistors 20 being arranged on the second surface 102, and the plurality of transistors 20 being arranged in an array; and a conductive structure 150, wherein the conductive structure 150 includes a conductive body 151 and a plurality of conductive bumps 152 arranged on the conductive body 151, the conductive body 151 is arranged on the first surface 101, the conductive bumps 152 and the transistors 20 are arranged in one-to-one correspondence, and the ends of the conductive bumps 152 away from the conductive body 151 pass through the substrate 10 and sources 21 of the transistors 20 and then are communicated with channel regions 22 of the transistors 20.

The material of the conductive body 151 and the material of the conductive bumps 152 are metal materials, for example, the materials of the conductive body 151 and the conductive bumps 152 may include one of copper, aluminum, or tungsten.

In the semiconductor structure provided by the embodiments of the present disclosure, a conductive structure is formed in the substrate, one end of the conductive structure is connected to the channel regions of the transistors, and when there are excess holes in the transistor, the holes can be transferred to the outside of the substrate by the conductive structure, thereby avoiding the floating gate effect between the substrate and the transistors and improving the performance of the semiconductor structure.

In some embodiments, the semiconductor structure further includes a first dielectric layer 60, the first dielectric layer 60 is arranged between the first surface 101 and the conductive body 151, and the ends of the conductive bumps 152 away from the conductive body 151 penetrate the first dielectric layer 60 and then are communicated with the channel regions 22 of the transistors 20, wherein the material of the first dielectric layer 60 may include silicon oxide.

In this embodiment, the first dielectric layer 60 can avoid electrical connection of the conductive body 151 to other devices arranged in the substrate 10, which ensures normal use of the semiconductor structure.

In some embodiments, the semiconductor structure further includes a second dielectric layer 130, and the second dielectric layer 130 is arranged on the surfaces of the conductive bumps 152, wherein the material of the second dielectric layer 130 may include silicon nitride.

In this embodiment, the second dielectric layer 130 can avoid electrical connection of the conductive bump 152 to a drain 23 of the transistor 20 or other devices arranged in the substrate 10, which ensures the performance of the semiconductor structure.

In some embodiments, the substrate 10 is provided with a plurality of bit line structures 50 arranged in a row direction of the transistors 20, the top surfaces of the bit line structures 50 are located on the second surface 102, and the sources 21 of the transistors 20 are connected to the bit line structures 50.

It should be noted that, in this embodiment, the row direction of the transistors 20 may be the X direction shown in the figures.

The plurality of bit line structures 50 may be arranged at intervals in the row direction of the transistors 20, and the bit line structures 50 may extend in a column direction of the transistors 20, that is, the bit line structures 50 may extend in a direction perpendicular to the X direction.

In some embodiments, the substrate 10 is formed with a plurality of word lines 40 arranged in the column direction of the transistors 20, and the word lines 40 are configured to connect the channel regions 22 of the plurality of transistors 20.

A third dielectric layer and an isolation layer stacked are formed on the word lines 40, the third dielectric layer abuts against the word lines 40, the third dielectric layer includes a silicon oxide layer, and the isolation layer includes a silicon nitride layer.

In some embodiments, a capacitor contact structure 160 is connected to the drain 23 of one of the transistor 20, and a capacitor structure 170 is connected to the capacitor contact structure 160, wherein the capacitor structure 170 includes an top electrode 171, a dielectric layer 172 and a bottom electrode 173, and a capacitor pad 180 may be connected to the bottom electrode 173.

It should be noted that the capacitor structure 170 and the capacitor contact structure 160 are further provided with a plurality of support layers and third dielectric layers alternately arranged in sequence.

Exemplarily, the capacitor contact structure 160 includes a first contact structure 161 and a second contact structure 162 adhered, the end of the first contact structure 161 away from the second contact structure 162 is connected to the drain 23 of one of the transistor 20, and the end of the second contact structure 162 away from the first contact structure 161 is connected to one of the capacitor structure 170.

This embodiment realizes the connection between the capacitor structure and the drains of the transistors through the capacitor contact structure. During actual application, when data needs to be written into the capacitor structure, a voltage is applied to the word lines to open the channel regions of the transistors, so that the sources of the transistors are connected to the drains. At this time, the data on the word lines is transmitted to the drains by the sources, and then transmitted to the capacitor structure by the capacitor contact structure for storage.

In this embodiment, the first contact structure 161 may be in a regular shape, for example, a rectangular shape or a cylindrical shape, or in an irregular shape.

Exemplarily, the first contact structure 161 includes a first segment 1611 and a second segment 1612 connected to the first segment 1611, the end of the first segment 1611 away from the second segment 1612 is connected to the drain 23, and the end of the second segment 1612 away from the first segment 1611 is connected to the second contact structure 162.

Taking a plane perpendicular to the substrate 10 as the longitudinal section, the longitudinal section of the first segment 1611 is a rectangle, and the longitudinal section of the second segment 1612 is a trapezoid enlarged from top to bottom, which can increase the area of the first contact structure 161 to reduce the resistance of the first contact structure 161 and improve the sensitivity of signal transmission.

The second contact structure 162 includes a third segment 1621 and a fourth segment 1622 connected to the third segment 1621, the end of the third segment 1621 away from the fourth segment 1622 is connected to the first contact structure 161, and the end of the fourth segment 1622 away from the third segment 1621 is connected to one end of the capacitor structure 170.

Taking the plane perpendicular to the substrate 10 as the longitudinal section, the longitudinal section of the third segment 1621 is a trapezoid reduced from top to bottom, and the longitudinal section of the fourth segment 1622 is a rectangle, which can enlarge the contact area between the second contact structure 162 and the first contact structure 161 to reduce the contact resistance and improve the sensitivity of signal transmission.

In some embodiments, the first contact structure 161 has a first surface and a second surface opposite to each other, that is, the first surface forms one end of the first segment 1611, and the second surface forms the end of the second segment 1612 away from the first segment 1611. The second contact structure 162 has a third surface and a fourth surface opposite to each other, that is, the third surface forms one end of the third segment 1621, and the fourth surface forms the end of the fourth segment 1622 away from the third segment 1621. The second surface is connected to the drain 23 of one of the transistors 20, the first surface is connected to the third surface, and the fourth surface is connected to one of the capacitor structures 170. The projection area of the first surface on the substrate 10 is larger than the projection area of the third surface on the substrate 10, which facilitates the alignment of the first contact structure 161 and the second contact structure 162.

In the semiconductor structure provided by the embodiments of the present disclosure, a conductive structure is formed in the substrate, one end of the conductive structure is connected to one of the channel region of the transistor, and when there are excess holes in the transistor, the holes can be transferred to the outside of the substrate by the conductive structure, thereby avoiding the floating gate effect between the substrate and the transistor and improving the performance of the semiconductor structure.

The embodiments or implementations in this specification are described in a progressive manner, each embodiment focuses on the differences from other embodiments, and the same or similar parts between the various embodiments may be referred to each other.

In the description of this specification, the descriptions with reference to the terms "embodiment", "exemplary embodiment", "some implementations", "schematic implementation", "example", etc. mean that specific features, structures, materials or characteristics described in conjunction with the embodiments or examples are included in at least one embodiment or example of the present application.

In this specification, the schematic descriptions of the above terms do not necessarily refer to the same embodiment or example. Moreover, the described specific features, structures, materials or characteristics may be combined in an appropriate manner in any one or more embodiments or examples.

In the description of the present disclosure, it should be noted that the orientations or positional relationships indicated by the terms "center", "upper", "lower", "left", "right", "vertical", "horizontal", "inner", "outer", etc. are based on the orientations or positional relationships shown in the accompanying drawings, and are intended to facilitate the description of the present disclosure and simplify the description only, rather than indicating or implying that the device or element referred to must have a particular orientation or be constructed and operated in a particular orientation, and will not to be interpreted as limiting the present disclosure.

It can be understood that the terms "first", "second", etc. used in the present disclosure can be used in the present disclosure to describe various structures, but these structures are not limited by these terms. These terms are only configured to distinguish the first structure from another structure.

In one or more drawings, the same elements are represented by similar reference numerals. For the sake of clarity, various parts in the drawings are not drawn to scale. In addition, some well-known parts may not be shown. For the sake of brevity, the structure obtained after several steps can be described in one figure. Many specific details of the present disclosure are described below, such as the structure, material, dimension, treatment process and technology of devices, in order to understand the present disclosure more clearly. However, as those skilled in the art can understand, the present disclosure may not be implemented according to these specific details.

Finally, it should be noted that the above embodiments are merely configured to describe, but not to limit, the technical solutions of the present disclosure. Although the present disclosure is described in detail with reference to the above embodiments, those of ordinary skill in the art should understand that various modifications may be made to the technical solutions described in the foregoing embodiments, or equivalent substitutions may be made to some or all technical features thereof, and these modifications or substitutions do not make the essences of the corresponding technical solutions depart from the scope of the technical solutions of the embodiments of the present disclosure.

INDUSTRIAL APPLICABILITY

In the method for manufacturing a semiconductor structure and the semiconductor structure provided by the embodiments of the present disclosure, a conductive structure is formed in the substrate, one end of the conductive structure is connected to the transistor, and when there are excess holes in the transistor, the holes can be transferred to the outside of the substrate by the conductive structure, thereby avoiding the floating gate effect between the substrate and the transistor and improving the performance of the semiconductor structure.

What is claimed is:

1. A method for manufacturing a semiconductor structure, comprising:
   providing a substrate, the substrate having a first surface and a second surface opposite to each other, and transistors being arranged on the second surface;
   forming release holes in the substrate, the release holes extending into the transistors, bottoms of the release holes being located in channel regions of the transistors, and top surfaces of the release holes being flush with the first surface; and
   forming a conductive structure in the release holes, the conductive structure extending to outside of the release holes and covering the first surface above the substrate;
   wherein the forming release holes in the substrate comprises:
   forming a mask layer on the first surface;
   forming a photoresist layer on the mask layer, and patterning the photoresist layer to form a mask pattern in the photoresist layer, the mask pattern comprising a plurality of first openings and bumps for separating the first openings, and projections of the first openings in the transistors being located in sources of the transistors; and
   removing the mask layer, the substrate, the sources of the transistors and part of the channel regions of the transistors that are exposed in the first openings, to form the release holes;
   wherein the removing the mask layer, the substrate, the sources of the transistors and part of the channel regions of the transistors that are exposed in the first openings, to form the release holes comprises:
   forming an oxide layer on side walls of the first openings, the oxide layer extending to outside of the first openings and covering a top surface of the mask layer, and the oxide layer located in the first openings enclosing second openings; and
   removing the mask layer, the substrate, the sources of the transistors and part of the channel regions of the transistors that are exposed in the second openings, to form the release holes.

2. The method for manufacturing the semiconductor structure according to claim 1, wherein the providing a substrate comprises:

providing an initial substrate, the initial substrate having a first initial surface and the second surface opposite to each other; and in a vertical direction where the first initial surface points to the second surface, removing part of a thickness of the initial substrate, a surface of a remaining of the initial substrate forming the first surface, and the remaining of the initial substrate forming the substrate.

3. The method for manufacturing the semiconductor structure according to claim 2, wherein removing part of the initial substrate along the first initial surface comprises:

planarizing the first initial surface by a chemical mechanical polishing process, and removing the part of the thickness of the initial substrate.

4. The method for manufacturing the semiconductor structure according to claim 1, before the forming a mask layer on the first surface, the method for manufacturing the semiconductor structure comprises:

forming a first dielectric layer on the first surface.

5. The method for manufacturing the semiconductor structure according to claim 4, wherein the forming a mask layer on the first surface comprises:

forming a first mask layer and a second mask layer sequentially stacked on the first dielectric layer, materials of the first mask layer and the second mask layer being different.

6. The method for manufacturing the semiconductor structure according to claim 5, wherein the forming a conductive structure in the release holes comprises:

forming a second initial dielectric layer in the release holes, the second initial dielectric layer extending to the outside of the release holes and covering the first dielectric layer;

removing the second initial dielectric layer on the first dielectric layer and the second initial dielectric layer on the bottoms of the release holes, a remaining of the second initial dielectric layer forming a second dielectric layer, and the second dielectric layer enclosing intermediate holes in the release holes; and forming the conductive structure in the intermediate holes, the conductive structure extending to outside of the intermediate holes and covering the first dielectric layer.

7. A semiconductor structure, comprising:

a substrate, the substrate having a first surface and a second surface opposite to each other, a plurality of transistors being arranged on the second surface, and the transistors being arranged in an array; and a conductive structure, the conductive structure comprising a conductive body and a plurality of conductive bumps arranged on the conductive body, the conductive body being arranged on the first surface, the conductive bumps and the transistors being arranged in one-to-one correspondence, and ends of the conductive bumps away from the conductive body passing through the substrate and sources of the transistors and then being communicated with channel regions of the transistors, wherein the substrate is provided with a plurality of bit line structures arranged in a row direction of the transistors, top surfaces of the bit line structures are located on the second surface, and the sources of the transistors are connected to the bit line structures.

8. The semiconductor structure according to claim 7, wherein a material of the conductive body and a material of the conductive bumps both comprise one of copper, aluminum, or tungsten.

9. The semiconductor structure according to claim 7, wherein the substrate is formed with a plurality of word lines arranged in a column direction of the transistors, and the word lines are configured to connect the channel regions of the transistors.

10. The semiconductor structure according to claim 7, wherein capacitor contact structures are connected to drains of the transistors, and capacitor structures are connected to the capacitor contact structures.

11. The semiconductor structure according to claim 10, wherein each of the capacitor contact structures comprises a first contact structure and a second contact structure adhered, an end of the first contact structure away from the second contact structure is connected to a drain of one of the transistors, and an end of the second contact structure away from the first contact structure is connected to one of the capacitor structures.

12. The semiconductor structure according to claim 11, wherein the first contact structure has a first surface and a second surface opposite to each other, and the second contact structure has a third surface and a fourth surface opposite to each other, wherein the second surface is connected to a drain of one of the transistors, the first surface is connected to the third surface, the fourth surface is connected to one of the capacitor structures, and a projection area of the first surface on the substrate is larger than a projection area of the third surface on the substrate.

* * * * *